United States Patent
Wilby (10) Patent No.: US 9,349,624 B2
(45) Date of Patent: May 24, 2016

(54) SEMICONDUCTOR WAFER MONITORING APPARATUS AND METHOD

(75) Inventor: Robert John Wilby, Bristol (GB)

(73) Assignee: METRYX LIMITED, Bristol (GB)

( * ) Notice: Subject to any disclaimer, the term of this patent is extended or adjusted under 35 U.S.C. 154(b) by 464 days.

(21) Appl. No.: 12/921,972

(22) PCT Filed: Mar. 10, 2009

(86) PCT No.: PCT/GB2009/000646
§ 371 (c)(1),
(2), (4) Date: Sep. 10, 2010

(87) PCT Pub. No.: WO2009/112821
PCT Pub. Date: Sep. 17, 2009

(65) Prior Publication Data
US 2011/0015773 A1      Jan. 20, 2011

(30) Foreign Application Priority Data

Mar. 11, 2008   (GB) .................................. 0804499.2

(51) Int. Cl.
*G06F 19/00*   (2011.01)
*H01L 21/67*   (2006.01)

(52) U.S. Cl.
CPC .............................. *H01L 21/67253* (2013.01)

(58) Field of Classification Search
CPC ..................................................... G06F 19/00
USPC ................ 700/109, 108; 702/94, 173; 141/98
See application file for complete search history.

(56) References Cited

U.S. PATENT DOCUMENTS

| 3,612,198 A | 10/1971 | Gallo |
| 4,888,994 A | 12/1989 | Nakamaki et al. |
| 5,321,634 A | 6/1994 | Obata et al. |
| 5,625,170 A | 4/1997 | Poris |

(Continued)

FOREIGN PATENT DOCUMENTS

| EP | 674158 | 9/1995 |
| JP | 61-020823 | 1/1986 |

(Continued)

OTHER PUBLICATIONS

English Translation JP-10-313038 Dainippon Screen Mfg Co Ltd Nov. 24, 1998.*

(Continued)

*Primary Examiner* — Tejal Gami
(74) *Attorney, Agent, or Firm* — Stephen J. Weyer, Esq.; Stites & Harbison, PLLC.

(57) ABSTRACT

Metrology methods and apparatus for semiconductor wafer fabrication in which data for metrology is obtained by detecting a measurable property of a monitored entity, which is either (i) a wafer transporter (e.g. a FOUP) loaded with one or more wafers to be monitored, or (ii) a plurality of wafers. Performing metrology measurements on a loaded wafer transporter enables the step of extracting wafer (s) from the transporter for metrology measurements to be omitted. Moreover, metrology measurement may be obtained while transporting the wafer (s) between treatment locations. By considering a plurality of wafers as a unit, a single measurement representing a combination of individual wafer responses is obtained. All wafers contribute to the metrology measurement without the need to perform individual wafer measurements.

11 Claims, 4 Drawing Sheets

(56) References Cited

U.S. PATENT DOCUMENTS

| | | | |
|---|---|---|---|
| 7,020,577 B2 | 3/2006 | Wilby | |
| 7,340,372 B2 | 3/2008 | Wilby | |
| 2002/0124906 A1* | 9/2002 | Suzuki et al. | 141/98 |
| 2003/0141572 A1 | 7/2003 | Wilby | |
| 2004/0040659 A1 | 3/2004 | Hasper | |
| 2004/0225462 A1* | 11/2004 | Renken et al. | 702/94 |

FOREIGN PATENT DOCUMENTS

| | | |
|---|---|---|
| JP | 61-149828 | 7/1986 |
| JP | H05-248926 | 9/1993 |
| JP | H06-050803 | 2/1994 |
| JP | 07 130821 | 5/1995 |
| JP | 10-313038 | 11/1998 |
| JP | 11-003927 | 1/1999 |
| JP | 11-195694 | 7/1999 |
| JP | 02000-260845 | 9/2000 |
| JP | 2001-118762 | 4/2001 |
| JP | 2007-208064 | 8/2007 |
| KR | 2002 0081726 | 10/2002 |

OTHER PUBLICATIONS

International Search Report for PCT/GB2009/000646.
Written Opinion of the International Searching Authority for PCT/GB2009/000646.
Office Action for Japanese Application No. 2010-550254, Mar. 19, 2013, Japanese Patent Office.
Office Action for EP Application No. 09719206.6, Jan. 2, 2014, European Patent Office.
English Translation of Japanese Office Action in Corresponding JP Application No. 2010-550254, dated Jun. 3, 2014.

* cited by examiner

SEMICONDUCTOR WAFER MONITORING APPARATUS AND METHOD

FIELD OF THE INVENTION

This invention relates to semiconductor wafer metrology.

BACKGROUND TO THE INVENTION

Microelectronic devices are fabricated on semiconductor wafers using a variety of techniques, e.g. including deposition techniques (CVD, PECVD, PVD, etc) and removal techniques (e.g. chemical etching, CMP, etc). Semiconductor e.g. silicon wafers may be further treated in ways that alter their mass e.g. by cleaning, ion implantation, lithography and the like.

Depending on the device being manufactured, each wafer may be passed sequentially through hundreds of different processing steps to build up and/or to remove the layers and materials necessary for its ultimate operation. In effect, each wafer is passed down a production line. The nature of semiconductor manufacturing means that certain processing steps or sequences of steps in the production flow may be repeated in a similar or identical fashion. For example, this may be to build up similar layers of metal conductors to interconnect different parts of the active circuitry.

To ensure consistency and interoperability of semiconductor equipment used in different factories, standards are adopted throughout the majority of the semiconductor manufacturing industry. For example, standards developed by Semiconductor Equipment and Materials International (SEMI) have a high degree of market uptake. One example of standardisation is the size and shape of the semiconductor (silicon) wafers: typically for volume production they are discs having a diameter of 300 mm.

During processing, wafers are typically transported around the production line (i.e. between different processes) within closed boxes, e.g. Standard Machine Interfaces (SMIFs) or Front Opening Unified Pods (FOUPs). These boxes provide physical and environmental protection for the wafers (especially from particles in the atmosphere which can pollute the surface to be treated) and to facilitate automated material handling. Each FOUP may have a standard configuration, e.g. holding a maximum of either 13 or (more commonly) 25 wafers.

The cost and complexity of the processing steps required to produce a completed silicon wafer together with the time that it takes to reach the end of the production line where its operation can be properly assessed has led to a desire to monitor the operation of the equipment on the production line and the quality of the wafers being processed throughout processing so that confidence in the performance and yield of the final wafers may be assured.

Wafer treatment techniques typically cause a change in mass at or on the surface of the semiconductor wafer. The configuration of the changes to the surface are often vital to the functioning of the device, so it is desirable for quality control purposes to assess wafers during production in order to determine whether they have the correct configuration.

Specialist metrology tools may be used within the production flow so that monitoring is conducted soon after the relevant process of interest and usually before any subsequent processing, i.e. between processing steps.

However, implementing wafer metrology often adds significant costs to the operation of the production line (e.g. simply by adding further manufacturing steps) while not increasing the volume or necessarily the quality of the devices being manufactured. For example, there are equipment running costs associated with the capital purchase and depreciation of the measurement equipment, the cost of the space required for the equipment in the treatment area ("cleanroom"), and the cost of facilities and services consumed by the equipment.

Moreover, monitoring the quality of wafers can impose operational costs associated with the reduced efficiency of the production line. If specially manufactured test wafers are used then the factory automated handling system typically has to route a special FOUP (containing the test wafers) to the correct equipment for processing and then to the measurement equipment for testing. Unproductive time is incurred on the processing equipment while the test wafers are processed because production wafers cannot be processed during this time. Alternatively, if measurements are made on product wafers, then for each process step that must be monitored the number of movements that a FOUP must make during its journey down the production line is doubled (since the FOUP may move to and from metrology apparatus between each processing step that is to be monitored). This increases the cycle time of the factory, the amount of storage needed for wafers in production (WIP storage) and queuing required before each piece of equipment and also places additional demands on the capacity of the automated FOUP handling system.

Because of the costs of implementing product wafer metrology, device manufacturers often implement sampling schemes where only a selection of wafers are measured, e.g. each wafer in only a certain number of FOUPs or only certain wafers within each FOUP or a selection of FOUPs. Both of these schemes introduce additional risks where errors may go undiscovered. There is the possibility of an equipment error occurring during the processing of wafers in a particular FOUP that is not selected for measurement. It is also possible for a FOUP to be processed with the wrong recipe so that, for example, the wrong layer is deposited or even that the FOUP is mis-scheduled so that an entire processing step is omitted. Even if the FOUP is selected for measurement then unless all the wafers in the FOUP are checked the potential for errors to occur on individual wafers still exists.

Measuring the change in mass of a wafer either side of a processing step is an attractive method for implementing product wafer metrology. It is relatively low cost, high speed and can accommodate different wafer circuitry patterns automatically. In addition it can often provide results of higher accuracy than alternative techniques. For example, on many typical materials, thicknesses of material layers can be resolved down to an atomic scale. The wafer in question is weighed before and after the processing step of interest. The change in mass is correlated to the performance of the production equipment and/or the desired properties of the wafer.

While the equipment running costs of mass metrology equipment might be lower than alternative methods, this technique can still suffer from the effects of reduced production line efficiency. Indeed, because of the requirement for pre and post processing measurements the efficiency of the production line may be negatively affected more than alternative measurement methods. FOUP and/or wafer sampling schemes are therefore often implemented where mass metrology is used. This can introduce the risks identified above.

SUMMARY OF THE INVENTION

The present application discloses two techniques which can increase the efficiency and throughput of metrology apparatus in a semiconductor wafer fabrication process.

Wafer Transporter Metrology

In a first aspect, the invention provides a semiconductor wafer metrology method in which measurements are made on one or more wafers contained in a loaded unit used for transporting a wafer between processing locations (i.e. a wafer transporter, e.g. a FOUP or a SMIF). In this aspect the step of extracting wafer(s) from a loaded unit to subject them to metrology measurements is omitted.

One advantage of this aspect is that time is saved by omitting the wafer extraction step. Another advantage is that because the transporter is the measured entity a wider range of measurement locations within a fabrication system (e.g. clean room) or on an automatic material handling system is available. This may further reduce the amount of time a metrology measurement takes e.g. by reducing the travel time to a measurement location between processing steps.

Furthermore, the inventor has realised that a number of the current limitations associated with wafer metrology can be improved by performing measurements on the product wafers while they are still within the FOUP environment. By monitoring the loaded unit, effectively all of the wafers within a FOUP (e.g. one or more wafers) can be measured together using metrology, e.g. mass metrology. Problems in processing can be picked up using such measurements. This idea is explored in more detail in the second aspect, discussed below.

Thus, according to the first aspect of the invention, there may be provided a method of monitoring semiconductor wafer fabrication, the method including detecting a measurable property of a monitored entity, wherein the monitored entity comprises a loaded wafer transporter. The wafer or wafers loaded in the transporter affect the measurable property, whereby if the loaded wafer or wafers are treated the measurable property changes.

The wafer transporter may be movable between a measurement zone in which the first and/or second values for the measurable property are detected and a treatment zone, where wafer processing occurs. The transporter may be unloadable and reloadable at the treatment zone. There may be a plurality of treatment zones and/or a plurality of measurement zones. The treatment zones may make up the processing line for a product semiconductor wafer. The measurement zones may be suitably arranged along the line up to promote efficient wafer movement between process steps and process monitoring (i.e. metrology) steps. Typically, treatment zones may be located in bays of an automated material handling system (AMHS). Wafer transporters may be moved between tools located in a single bay by an intra-bay transport mechanism (e.g. overhead rail). Wafer transporters may be moved between bays by an inter-bay transport mechanism. There may be a plurality of interchange points between the intra-bay and inter-bay mechanisms. The measurement zones may be provided on or be accessible from the inter-bay transport mechanism. They may be provided at the interchange points, e.g. at positions which may be frequently visited by wafer transporters.

The wafer transporter may enclose the loaded wafers to protect them from contamination by particles in the atmosphere. The wafer transporter may be a Front Opening Unified Pod (FOUP), e.g. capable of holding 13 or 25 wafers. The FOUP may be part of the AMHS, which may be implemented on the processing line up to manage the movement of FOUPs between different treatment apparatuses (e.g. tools within a bay) and to manage the storage and queuing of FOUPs not currently being processed. A mechanism for taking the metrology measurements may be integrated into the AMHS. For example, where the AMHS is implemented utilising an overhead track, the metrology system may be integrated into the track so that FOUPs are measured as they temporarily stop while travelling along the track. Alternatively, measurement apparatuses may be provided at various locations along the track, e.g. on a storage shelf below the track. Metrology may thus be efficiently performed during movement between treatment tools. This may eliminate a need for any separate scheduled moves or additional WIP queuing.

Alternatively the measurement apparatus may be integrated into a load/unload mechanism of processing equipment. For example, the measurement apparatus may be attached to kinematic pins in a loadport of the processing equipment. Measurement can therefore be performed before docking and after undocking a FOUP in a loadport.

In one embodiment, the same measuring apparatus is used to obtain pre and post treatment measurements. This may minimise or eliminate errors due to differences between measurement apparatuses, e.g. different spring constants where vibrations are measured. Otherwise, spring constants may be matched between measuring apparatuses. It may therefore be desirable to have a measurement zone close to each treatment zone.

The behaviour of comparison result from FOUP to FOUP can be monitored to give an indication of the stability of the treatment being undertaken between measurement steps. Any slight drift or step change in the required characteristics can be identified in the trend of the FOUP measurements.

Maintaining isolation of the wafers within a FOUP during metrology measurements may have significant advantages for the production line. In previous arrangements, where metrology measurements were performed on individual wafers, the wafers had to be unloaded from the FOUP, which carried the risk of introducing defects or particles onto each wafer every time the FOUP door opened and a wafer was removed for measurement. This risk is eliminated by not having to open the FOUP door for metrology measurements.

Moreover, a significant proportion of the manufacturing cost of a piece of measurement equipment may be taken up by the mechanisms required to perform the actions necessary to measure the wafers outside a FOUP. For example, an unloading mechanism may be required to open the FOUP door, an environment conditioning unit may be required to minimise particulate contamination of the wafers when they are outside the FOUP and a robotic arm with a specialised end attachment may be required to move each wafer from the FOUP to the place of measurement.

The invention may significantly enhance the operation speed (e.g. throughput) of the wafer processing line up. A typical wafer metrology system may only be able to measure 3-5 FOUPs per hour if each wafer within a 25-wafer FOUP is measured. This might rise to 10-15 FOUPs per hour if a sampling scheme is used e.g. where only 3 wafers in each FOUP are measured. In the invention, where all the wafers in a FOUP are measured simultaneously the throughput can be more than 120 FOUPs per hour, e.g. up to 200 FOUPs per hour.

In one embodiment, the metrology technique includes a determination of the mass of the loaded wafer transporter (e.g. FOUP or SMIF). This embodiment may be implemented by a weighing system where the force of gravity is accurately measured using a force sensor. At medium levels of accuracy this force can be assumed to be due solely to the mass of the FOUP. However, if higher levels of accuracy are needed, other forces may need to be taken into account. One such force is caused by atmospheric buoyancy. If measurements are taken in an atmosphere (i.e. not a vacuum), the FOUP will displace a volume of this atmosphere, which causes an up thrust force. The up thrust force depends on the atmospheric (air) density, which in turn depends on numerous factors including temperature, atmospheric pressure, relative humidity and air composition. The up thrust force reduces the apparent weight of the FOUP detected by the force sensor. The invention may include steps arranged to compensate for atmospheric buoyancy.

Sensors may be provided to monitor temperature, pressure and relative humidity. A processor may receive measurements from these sensors and use them to calculate the air density, which can be used to compensate for buoyancy in a corresponding weight measurement.

The air surrounding the FOUP may exert a buoyancy force (in the opposite direction to a weight force) thereon which can be measurably different before and after a treatment step e.g. due to fluctuations in ambient temperature and pressure. The buoyancy force depends on the volume of the FOUP, which experiences no substantial change between metrology measurements. Indeed, the only non-negligible change between metrology measurements may be the change in mass of the FOUP contents (i.e. the mass of the plurality of wafers and air within the FOUP).

Treating the semiconductor wafers can cause them to heat up, which means that when they are returned to the FOUP the temperature within the FOUP may not be the same as the surrounding environment. The air density and hence mass of air within the FOUP may therefore change between pre and post measurements. If there is sufficient queuing time, it may be possible to wait for the temperature to equalize. Alternatively, temperature equalization may be facilitated by providing a fan to blow filtered air into the FOUP to negate the effect of air inside the FOUP on atmospheric buoyancy. In a further alternative, temperature and humidity sensors may be arranged to measure conditions in the FOUP to permit the air density in the FOUP to be calculated.

Buoyancy correction measurements can be complicated, but the inventor has identified an alternative measurement technique, in which buoyancy correction is not required. In such an alternative embodiment, the measured parameter may be a vibration frequency. In this embodiment, the loaded transporter (FOUP and its contents) is attached to a spring element and is initially perturbed by a force so that it resonates at a natural frequency related to its mass and a spring constant. The FOUP may be oscillated in a horizontal direction so that coupled vibrations from the wafers themselves do not complicate the expected response. Moreover, the perturbing force may aim to excite a resonant frequency in the system that is far away from the wafers natural frequency to avoid resonating the wafers. The perturbing force may be selected to be close in frequency to an expected natural resonant frequency of the loaded transporter. Alternatively, the perturbing force may aim to excite a resonant frequency of the wafers loaded in the transporter. In such an embodiment the wafer vibration may be detectable while the transporter vibration is negligible.

The first aspect of the invention may also provide apparatus for monitoring semiconductor wafer fabrication, the apparatus having a weighing instrument for measuring the weight of a wafer transporter loaded with one or more semiconductor wafers and monitoring means arranged to determine the buoyancy exerted on the transporter by the atmosphere at the weighing instrument.

The apparatus may include a movement mechanism arranged to move the wafer transporter between the weighing instrument and wafer processing equipment.

The monitoring means may be arranged to sense conditions inside and outside of the wafer transporter. The monitoring means may include a temperature monitor, a pressure monitor and a humidity monitor arranged to determine the temperature, pressure and humidity around the weighing instrument and/or inside the transporter.

The pressure monitor may include a pressure sensor having an accuracy of better than 0.4% over the range 800-1200 mbar absolute. Temperature sensitivity may be less than 0.02%/° C. Response time may be less than 200 ms. The temperature monitor may have a temperature sensor with an accuracy of better than 0.2° C. and a response time of less than 10 seconds. The humidity monitor may have a humidity sensor with an accuracy of better than 2% and a response time of less than 1 minute.

The weighing instrument may have readability of 0.25 mg over a range of 0-8 kg or 0-10 kg. The instrument may have a repeatability of better than 0.75 mg and a temperature sensitivity drift of less than 1 part in $10^6$/° C.

The apparatus may include a temperature equaliser for maintaining a substantially constant temperature inside the transporter. The temperature equaliser may include a fan for blowing gas (e.g. filtered air) into the transporter.

The first aspect of the invention may also provide apparatus for monitoring semiconductor wafer fabrication, the apparatus including: a support structure arranged to support a wafer transporter loaded with semiconductor wafers; a vibration exciting device arranged to vibrate the wafer transporter; and a measurement device for measuring a frequency response of the wafer transporter. A change in frequency response detected before and after wafers loaded in the transporter are treated may be representative of a change in mass of the treated wafers and can be used to monitor the treatment as discussed above.

Other metrology techniques may be applicable to a loaded wafer transporter. For example, if the transporter is transparent to infra-red or X-ray radiation, Fourier Transform Infra Red (FTIR) spectroscopy or X-Ray Reflectometry (XRR) techniques can be used to obtain measurements for one or more wafers while those wafers remain inside the wafer transporter environment.

Multi-Wafer Metrology

In a second aspect, the invention provides a semiconductor wafer metrology technique in which a monitored element includes a plurality of wafers, i.e. a single metrology measurement result is obtained for a group of wafers. For example, the monitored element could be a FOUP loaded with a plurality of wafers or a plurality of wafers extracted together from a FOUP.

Previous metrology techniques have focussed on obtaining accurate measurements from individual wafers. The present invention proposes considering a plurality of wafers as a unit by taking a measurement of that unit. The single result of the measurement may be considered as a combination of individual wafer responses, but in this aspect the individual wafer responses are not separately detected. What is detected is effectively a combination of the individual responses of the wafers, which may combine in an additive manner to provide a larger (in absolute terms) measurable entity. The proposed technique may be used as a high level check for errors. A fabrication error in one or more of the group of wafers may cause its contribution to the detected result to fall outside an expected range, which will affect the detected result e.g. to prompt further investigation of which wafer is faulty via individual measurements. Moreover, the measurements taken for each group of wafers may be compared with each other to give an indication of the stability of the process step or steps being monitored, e.g. to enable preventative action to be taken before problems actually occur. The technique of the second aspect may provide a relatively high throughput for the high level check, which can improve the overall efficiency of fabrication. The inventor has thus realised that conventional metrology techniques of obtaining a measurement for each individual wafer can be improved by taking a group measurement to identify the presence of an error and then, if necessary, individual measurements to identify the faulty wafer and the nature of the error.

The present invention is concerned with metrology measurements, i.e. measurements which can identify changes to a wafer caused by treatment. Changes to wafers caused a single processing step may be too small to be detected by comparison with a predetermined reference value. For example, each processing step may affect less than 0.5% of the material of each processed wafer. A metrology measurement must be able to detect this change with enough accuracy to determine whether or not it falls within acceptable bounds. In the invention, a group metrology measurement is obtained in which the sum of changes to a plurality of wafers caused by one or more wafer treatment steps of that plurality of wafers may be obtained.

In one embodiment, the monitored entity may be the mass of the plurality of wafers. The mass change of a single wafer due to one processing step may be less than 0.5% of the single wafer mass (e.g. a change of 650 mg or less for a wafer having a mass of 130 g).

Since the combined responses produces a large measurable phenomenon, it may be possible to obtain a greater relative resolution for the measurement or use a measurement device with lower resolution.

Thus, according to the second aspect of the invention, there may be provided a method of monitoring semiconductor wafer fabrication, the method including detecting a measurable property of a monitored entity, wherein the monitored entity comprises a plurality of semiconductor wafers. A single result for use in metrology is therefore detected for the plurality of semiconductor wafers. For example, a single instrument may be arranged to detect substantially simultaneously the measurable property of each wafer of the plurality wafers such that what is detected is a single result for that group of wafers. The measurable property may correspond to an aggregate (e.g. sum) of individual wafer properties. The individual wafer properties are not detected separately in the detection of the measurable property of the monitored entity. Indeed, the measurable property of the monitored entity may lie in a repeatable detection range of a measurement instrument whereas each individual wafer property, if measured, would lie outside the range.

Similarly to sampling schemes, the second aspect of the invention does not permit the precise characteristics of each wafer to be checked individually. However, unlike sampling schemes, in the invention each wafer in the transporter contributes to the metrology measurement (e.g. total mass). If any wafer has been incorrectly processed or not processed at all then the method of the invention may permit identification that an error has occurred.

The measurable property may be detected for the same monitored entity before and after a wafer treatment step to enable a comparison to be performed to assess a change caused by the treatment step. Thus, the method may comprise obtaining a first group metrology measurement for a plurality of semiconductor wafers to be treated; treating the semiconductor wafers; obtaining a second group metrology measurement for the plurality of semiconductor wafers after treatment; and comparing the first and second group metrology measurements to monitor the treatment.

The method of the second aspect may be performed on groups of semiconductor wafers that are extracted from a wafer transporter. Such embodiments may be useful where processing equipment includes a set of tools which perform similar wafer treatment in parallel. For example, in so-called cluster tools a plurality of identical treatment chambers are positioned around a hub which receives a wafer transporter. The wafers in the transporter may be distributed between the treatment chambers for treatment. Treating in parallel can increase throughput. In one embodiment of the second aspect, the monitored entity may be a group of wafers that are each treated in a particular treatment chamber of a cluster tool. Thus, extraction apparatus may be provided for extracting such a group from a wafer transporter so that a metrology measurement can be performed. The extraction apparatus may be arranged to remove wafers from the transporter in a selectable (configurable), e.g. regular, fashion, e.g. every fourth wafer, to match how the wafers may be distributed between chambers in the cluster tool. The extraction apparatus may include a multi-fingered tool to simultaneously extract a group of wafers.

By performing metrology on a subset of the transporter contents, it is possible to more accurately target a problem source when an error is detected. When a fault occurs only in measurements of one subset, it is possible to trace the problem to the specific treatment chambers used for that subset.

The measurable property may be any property used in conventional metrology, i.e. the detecting step may be implemented using known metrology techniques, e.g. atmospheric buoyancy-corrected mass measurement, Fourier Transform Infra Red (FTIR) spectroscopy or X-Ray Reflectometry (XRR). In the latter two examples, a single beam of incident radiation may be split into a plurality of separate sub-beams which are each directed to a respective one of the plurality of wafers. A response signal from each wafer may be combined before being detected. However, the invention may make use of the fact that silicon wafers typically transmit infra-red radiation by directing a single beam of incident radiation through the plurality of semiconductor wafers in series and detecting the result.

In one embodiment, the first and second aspects of the invention are combined, whereby the monitored entity comprises a plurality of semiconductor wafers contained in a wafer transporter. In this case, because multiple wafers may be measured simultaneously the total mass to be measured will be increased. However, the change in total mass is due to an individual change to the mass of each wafer and so the total mass change will increase as well. The combination of the first and second aspects of the invention may be expressed as a method of monitoring semiconductor wafer fabrication, the method including: obtaining a first metrology measurement for a wafer transporter loaded with a plurality of semiconductor wafers to be treated; unloading the semiconductor wafers from the wafer transporter; performing treatment on the unloaded semiconductor wafers; reloading the treated semiconductor wafers into the wafer transporter; obtaining a second metrology measurement for the wafer transporter loaded with the treated semiconductor wafers; and comparing the first and second metrology measurements to monitor the treatment of the wafers.

In one implementation of this embodiment, the measurable property detected in the metrology measurement steps may be the mass of the loaded transporter. Thus, the mass of the wafer transporter may be included in the detected measurable property.

An alternative expression of this embodiment may be expressed as a method of monitoring one or more semiconductor treatment steps, the method including: before the treatment step(s) are performed, obtaining a first value for a measured parameter that is representative of the mass of a wafer transporter loaded with one or more semiconductor wafers to be treated; performing the treatment step(s) on the semiconductor wafer; after the treatment step(s) are performed, obtaining a second value for the measured parameter which is representative of a mass of the wafer transporter loaded with the treated semiconductor wafer(s); and comparing the first and second values to monitor the treatment step(s). The measured parameter need not be a direct weight force measurement. For example, it may be a natural frequency of vibrations of the loaded wafer transporter which are excited by applying an oscillating impulse. Such a measured parameter is representative of (e.g. dependent on) the mass of the loaded wafer transporter such that changes in the mass of the transporter are reflected in changes in the measured parameter. Absolute values of the measured parameter may not be necessary; the important factor may be the result of the comparison, e.g. its behaviour over time or how it matches an expectation.

Mass metrology is advantageous when applied to both aspects of the invention. This is because it can be performed remotely, i.e. does not require direct access to the surface of the wafer(s) where the treatment (i.e. wafer processing) has taken place. The mass associated with the transporter itself may stay sufficiently similar between pre and post processing measurements so that it will substantially cancel out when the first and second measurements are compared. For example, a mass difference associated with the process step of interest may be calculated by subtracting the first mass measurement from the second mass measurement. In such a case, each mass measurement may involve a direct measurement of the weight of the loaded transporter. Other types of mass measurement, i.e. a measurement of a parameter associated with or representative of the mass of the loaded transporter are also possible.

The monitored semiconductor fabrication process may include any type of wafer treatment which results in a change of mass of a wafer, e.g. deposition techniques such as CVD, PECVD and PVD; removal techniques such as chemical etching and CMP, and/or cleaning, ion implantation, lithography and the like. The processing that is monitored may be a single treatment step or a series of steps.

BRIEF DESCRIPTION OF THE DRAWINGS

Embodiments of both aspects of the invention are described below with reference to the accompanying drawings, in which.

DETAILED DESCRIPTION; FURTHERS OPTIONS AND PREFERENCES

Figure 1:
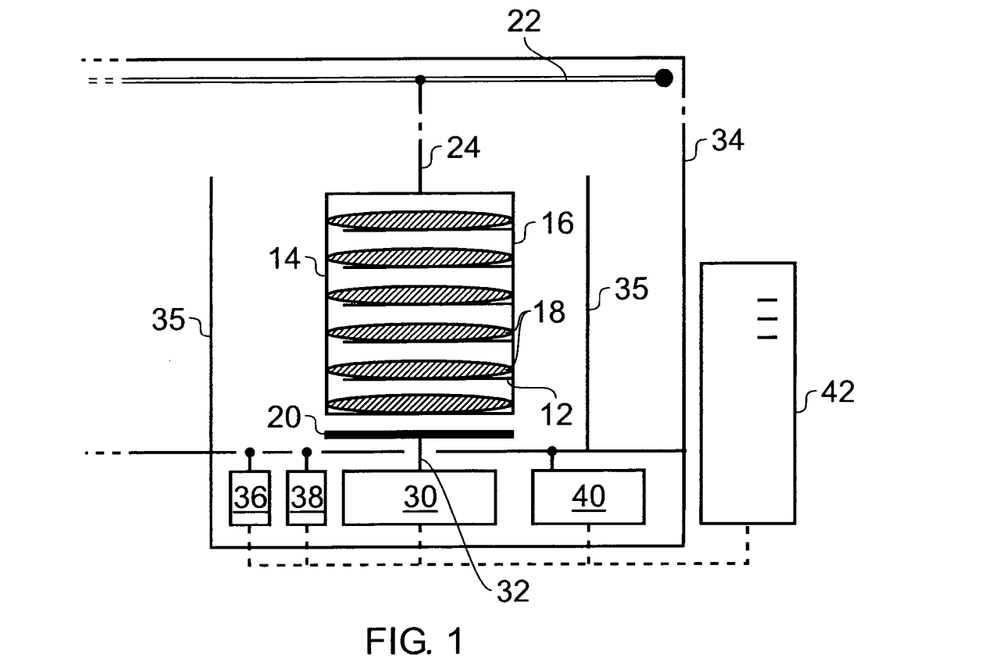
FIG. 1 shows apparatus for performing an atmospheric buoyancy compensated mass measurement for a loaded FOUP.

FIG. 1 shows a schematic view of part of a semiconductor wafer processing plant. The plant comprises a chamber (e.g. "clean room") 34 in which a transporter unit (which in this embodiment is a FOUP) 16 (typically a plurality of such units) carry semiconductor wafers 18 between processing equipment (not shown) and metrology apparatus (discussed below). In this embodiment, the transporter unit 16 is a FOUP attached to an overhead rail 22 via an attachment arm 24. The FOUP 16 has a front door 14 which is openable into a cavity containing a plurality of shelves 12, each shelf 12 being arranged securely to retain a semiconductor wafer 18. When the front door 14 is closed the cavity in the FOUP 16 is protected from the environment in the chamber 34.

The overhead rail 22 may be part of a automated material handling system (AMHS) which controls automatically the movement of transporter units within the chamber 34. Such systems are already known for moving FOUPs around a semiconductor processing plant.

In the embodiment, the attachment arm 24 is extendable to permit the FOUP 16 to be deposited on a pan 20 of a weighing instrument 30 inside a metrology enclosure defined by walls 35. The walls 35 are provided to prevent air currents in the chamber 34 from affecting the weight measurement. The weighing instrument 30 may be a 10 kg mass comparator with a dummy weight. The pan 20 is located in an upper portion of the metrology enclosure and the weighing instrument 30 in a lower portion. The two portions are partitioned with a through hole for the rod 32.

The weighing instrument 30 can obtain a mass measurement for the FOUP 16 by detecting the weight of the FOUP 16 due to gravity. The mass of the semiconductor wafers 18 contained in the FOUP 16 will contribute to the value of mass measurement. Consequently, if a mass measurement is taken before and after the semiconductor wafers 18 contained in the FOUP 16 are treated, then any change in mass of the semiconductor wafers 18 caused by the treated will be reflected in a change in the FOUP mass measurement. The metrology apparatus may be configured to minimise the effect of other factors on the mass measurement. For example, the FOUP 16 and the specific wafers contained therein are the same for mass measurements undertaken before and after the wafer treatment.

The effect of atmospheric buoyancy may also be compensated for, as explained below. The chamber 34 further contains a temperature sensor 36, a humidity sensor 38 and a pressure sensor 40. The sensors are mounted such that there sensing elements are located in the upper portion of the chamber 34, with the pan 20. The measurements made by these sensors can be used to compensate for the effect of atmospheric buoyancy on the FOUP 16. The pressure sensor 40 may be a Druck PMP4010AB. The temperature and humidity sensors can be combined, e.g. as a Pico RH02. The measurements taken by these sensors are fed to a processing unit 42, e.g. an external PC or internal microprocessor, to allow the air density to be calculated, e.g. using $$\rho_{air} = \frac{0.3485P - 0.00132 \times (0.0398T^2 - 0.1036T + 9.5366) \times H}{(273.14 + T) \times 1000}$$

where $\rho_{air}$ is the density of air in g/cm$^3$, P is the pressure in mBar, T is the temperature in ° C. and H is the relative humidity expressed as a percentage. The air density can be used to calculate the effect of atmospheric buoyancy on the transporter unit 16 using the equation $$B = \rho_{air} V_v$$

where B is the atmospheric buoyancy effect in grams, $\rho_{air}$ is the calculated air density outside the transporter in g/cm$^3$, and $V_t$ is the volume of space occupied by the transporter in cm³. The mass of the transporter may therefore be expressed as $$M_t = W_t - B,$$

where $M_t$ is the atmospheric buoyancy-compensated mass of the transporter in grams and $W_t$ is the detected weight of the transporter in grams (for simplicity the standard gravity constant is omitted from the above analysis).

In embodiments where the temperature is equalized between the inside and outside of the transporter, $V_t$ is the volume physically occupied by the transporter and wafers only (i.e. excluding the air volume within the transporter). In this case a change in the mass of the loaded wafers $\Delta m_w$ may be simply expressed as $M_t^{post} - M_t^{pre}$, where the superscript pre and post indicate measurements taken before and after wafer treatment respectively.

In embodiments where the temperature is different, $V_t$ is the whole volume within the boundaries of the transporter (i.e. including the air volume within the transporter). In this case the change in transporter mass may be expressed as $$\Delta M_t = \Delta m_w + \Delta m_{air},$$

where $\Delta m_{air}$ is the change of mass of air within the transporter, i.e.

$$\Delta m_{air} = (\rho_{air}^{post} - \rho_{air}^{pre}) V_{air},$$

where $V_{air}$ is the volume of air inside the transporter, and $\rho_{air}^{pre}$ and $\rho_{air}^{post}$ are air densities inside the transporter calculated from according to the formula above for temperatures and humidity detected inside the transporter.

Thus, the apparatus in FIG. 1 can be used to perform differential comparisons on the weight of a loaded FOUP to monitor the effect of processing performed on wafers transported by that FOUP. Since the processing effect on all wafers in the FOUP will be reflected in the mass measurements, this apparatus may identify errors that can be missed by known 'sampling' techniques without degrading the throughput of the metrology section.

Figure 2:
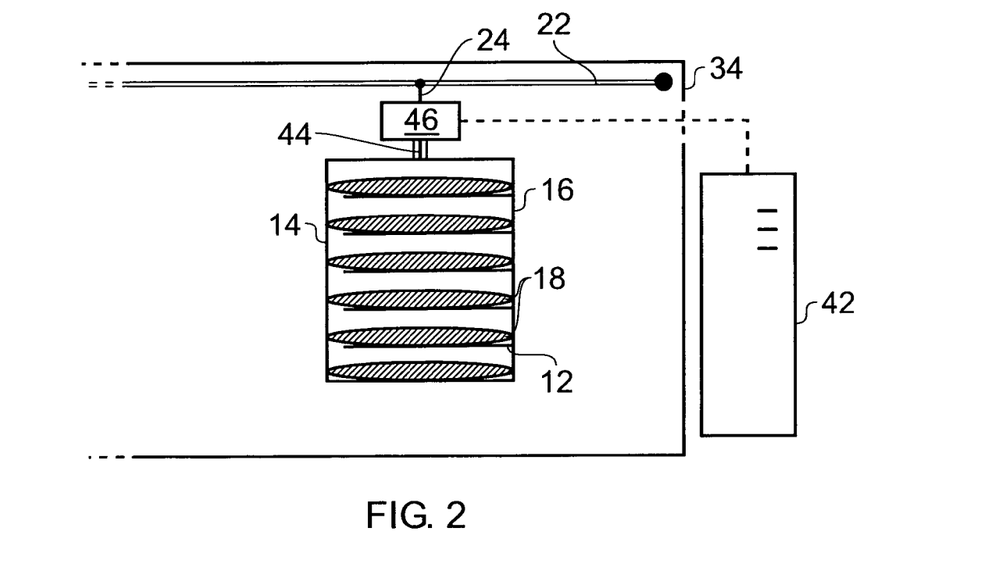
FIG. 2 shows apparatus for exciting and detecting a resonant vibration frequency of a loaded FOUP.

FIG. 2 shows another schematic view of a semiconductor processing plant which contains metrology apparatus that is another embodiment of the invention. In this embodiment, the metrology apparatus is integrated into the AMHS such that it moves with the FOUP 16 along the overhead rail 22 inside the chamber 34. This permits metrology to be performed at any location in the chamber, which can increase the overall efficiency of the plant.

As with the embodiment shown in FIG. 1, the FOUP 16 (which acts as a wafer transporter) is loaded with semiconductor wafers 18, which are retained by shelves 12 inside a cavity which is sealed from the atmosphere in the chamber 34 by an openable door 14. The FOUP 16 is attached to a vibration excitation/detection device 46 via support 44. The vibration excitation/detection device 46 is suspended from the overhead rail 22 by attachment arm 24 such that it can move with the FOUP 16 around the chamber 34. In an alternative arrangement, the vibration excitation/detection device 46 may be provided underneath a pan in an isolated enclosure similar to the metrology enclosure discussed above with reference to FIG. 1.

The vibration excitation/detection device 46 (e.g. voice coil or the like) is arranged to excite vibrations of the FOUP 16 through support 44. The support may be a spring, and the excited vibrations may be varied over a range of frequencies to discover the resonant frequency the system. Resonant frequency depends on the mass attached to the free end of the spring, so detecting the resonant frequency of the system is one way of obtaining a value for a measurable parameter which is representative of the mass of the FOUP. If the mass of the FOUP changes (i.e. the mass of the loaded semiconductor wafers 18 changes due to treatment) then the resonant frequency of the system will change. The vibration excitation/detection device 46 is connected (wired or wirelessly) to a processing unit 42 which is arranged to process a signal from the vibration excitation/detection device 46 to identify the resonant frequency.

The support 44 is substantially frictionless, and is arranged to both support the weight of the FOUP 16 and limit the degrees of freedom to the one of interest while it oscillates. This may be implemented using either an air bearing table, or a flexure bearing mechanism.

To detect the frequency of vibration, the vibration excitation/detection device 46 may include a frequency sensor (not shown). The frequency sensor may be of any known type, e.g. a triangulating laser distance sensor or an optical focus sensor, wherein an incident beam of radiation (e.g. light or laser beam) which reflects off the FOUP causes properties in the sensor to change as the distance the beam travels varies. The embodiment may be arranged to detect free or forced oscillations.

Figure 3:
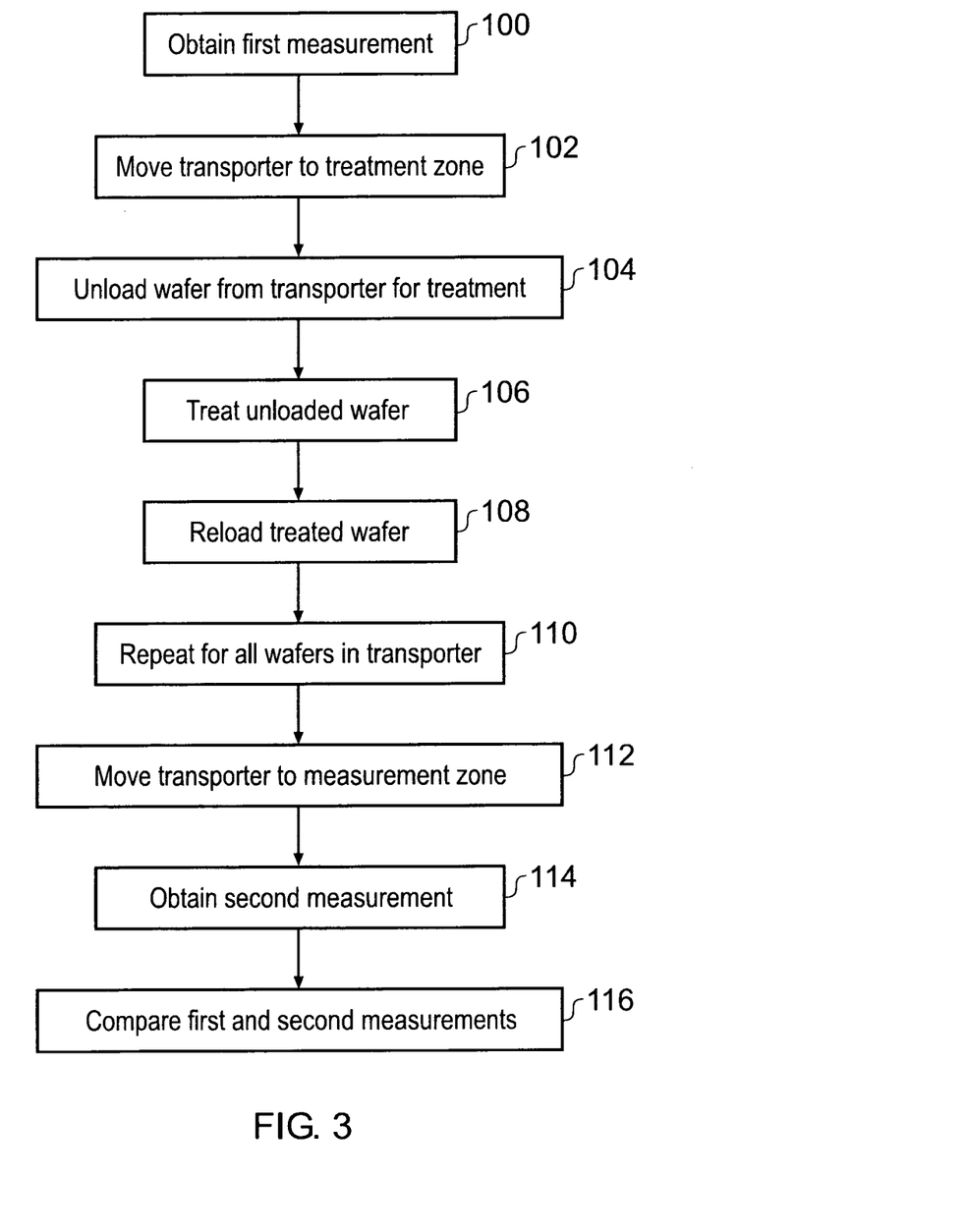
FIG. 3 is a flow chart illustrating a method of monitoring semiconductor wafer fabrication that is embodiment of the invention.

FIG. 3 is a flow chart illustrating a method of monitoring semiconductor fabrication that is an embodiment of the invention. The method may be implemented using the apparatus shown in either FIG. 1 or FIG. 2. This method begins with a wafer transporter (e.g. FOUP) loaded with semiconductor wafers in a measurement (metrology) zone of a semiconductor processing plant. The FOUP may be moved into the measurement zone using an AMHS. The first step in the method is at block 100 and is obtaining a first measurement of a parameter that is representative of the mass of the FOUP. As discussed above, this may be a resonant vibration frequency for the FOUP or an atmospheric buoyancy compensated weight measurement.

After the first measurement is obtained the method moves to block 102, where the transporter is moved from the measurement zone to a treatment zone in the semiconductor processing plant, whereat the semiconductor wafers can be treated in any of a variety of ways, e.g. etching, deposition or the like.

When the transporter arrives at the treatment zone the method moves to block 104, where a semiconductor wafer is unloaded from the transporter. At block 106 the unloaded semiconductor is then treated. At block 108, the wafer is reloaded into the transporter after treatment. Steps 104, 106 and 108 are repeated for each wafer in the transporter until all of the wafers have been treated and reloaded. In an alternative embodiment, all of the wafers may be unloaded so that they can be treated simultaneously.

After the wafers are all treated and reloaded, the method moves to step 112, where the transporter is moved from the treatment zone to a measurement zone. The measurement zone may be the same as or different from the measurement zone used at step 100. As seen in the embodiment illustrated in FIG. 2, the measurement apparatus may be associated with the transporter, in which case the measurement zone may be at any point in the processing plant, even within a treatment zone.

When the transporter is in a measurement zone the method moves to step 114, where a second measurement of a parameter that is representative of the mass of the FOUP is obtained. The measurement conditions are desirably arranged so that the main difference between the measurements is due to the change in mass of the loaded wafers caused by the treatment.

After the second measurement is obtained, the method moves to block 116, where the first and second measurements are compared to obtain a differential result which can be used as a representative value for the treatment to the wafers. This value may be compared with a standard or threshold to determine if any error has occurred during the treatment of the semiconductor wafers. For example, if the treatment involved the removal of material from the wafers and the differential result may indicate that the loss of mass was not sufficient, i.e. that a wafer may have not been processed properly.

Figure 4A:
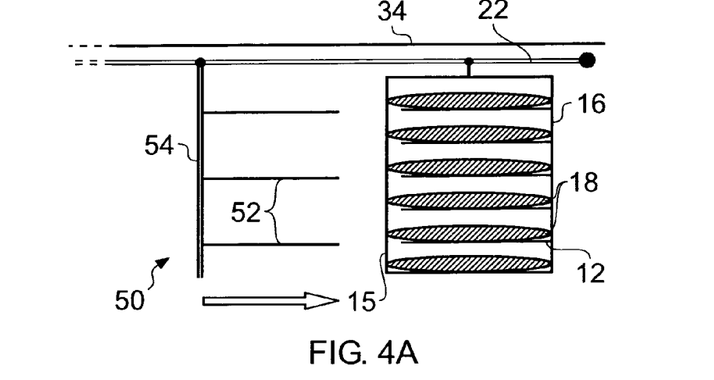
FIGS. 4A and 4B show a wafer extraction apparatus.
Figure 4B:
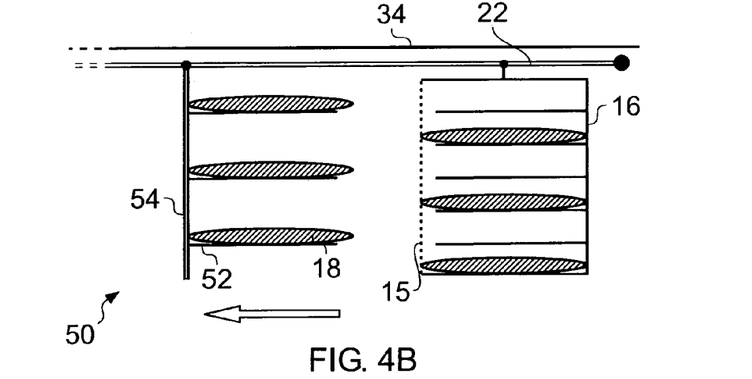

In other embodiments, metrology measurements may be performed on a plurality of wafers extracted from the FOUP environment. FIGS. 4A and 4B show an example of an extraction process in which a group of wafers can be extracted simultaneously from a transporter. In an alternative (unillustrated) embodiment, a conventional robot arm may unload single wafers in sequence and deposit e.g. stack them on a metrology instrument.

FIG. 4A shows the wafer transporter 16 depicted in FIG. 1 depending from overhead rail 22 in a treatment chamber 34. The transporter 16 contains six wafers 18 on shelves 12. In FIG. 4A the door of the transporter 16 is opened to expose the wafers 18 through aperture 15. A wafer extractor 50 is movably mounted on the rail 22 to extract three wafers from the transporter 16. Although this embodiment illustrates the extraction of three wafers from transporter holding six wafers, the invention places no restriction on the number of extracted or retained wafers. The wafer extractor 50 comprises a plurality of insertable trays 52 attached to a backing plate 54 which is movable along the rail 22. The insertable trays 52 are receivable through the aperture 15 to engage with the wafers to be extracted. FIG. 4B shows the wafer extractor 50 leaving the transporter 16 with the extracted wafers, which can then be transported to measurement apparatus (e.g. a weighing instrument similar to the arrangement shown in FIG. 1) for obtaining a single metrology measurement for the group of extracted wafers.

Figure 5A:
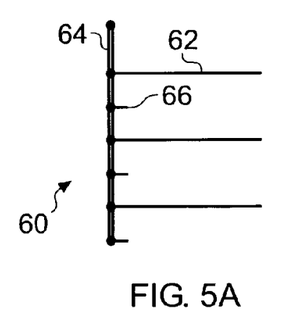
FIGS. 5A, 5B and 5C show a selective wafer extraction apparatus.
Figure 5B:
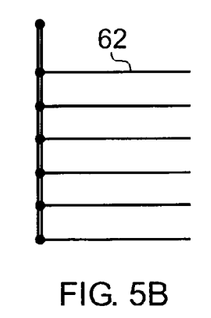
Figure 5C:
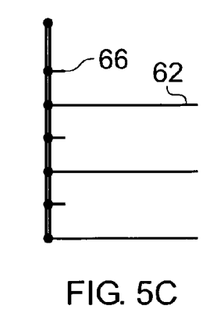

FIGS. 5A, 5B and 5C shown three different configurations of a wafer extractor 60 which is arranged to extract a user-selectable group of wafers. The wafer extractor 60 comprises a backing plate 64 which supports six trays. The trays are hinged to the support to move between and selectively occupy an extended position 62 or a retracted position 66.

FIG. 5A shows a configuration with three alternate trays in the extended configuration 62 and three trays in the retracted configuration 66. FIG. 5B shows a configuration in which all of the trays occupy the extended configuration 62. FIG. 5C shows a configuration which is the opposite of that shown in FIG. 5A, i.e. the three trays that were retracted in FIG. 5A are now in the extended configuration 62 and the three trays that were extended in FIG. 5A are now in the retracted configuration 66.

Figure 6:
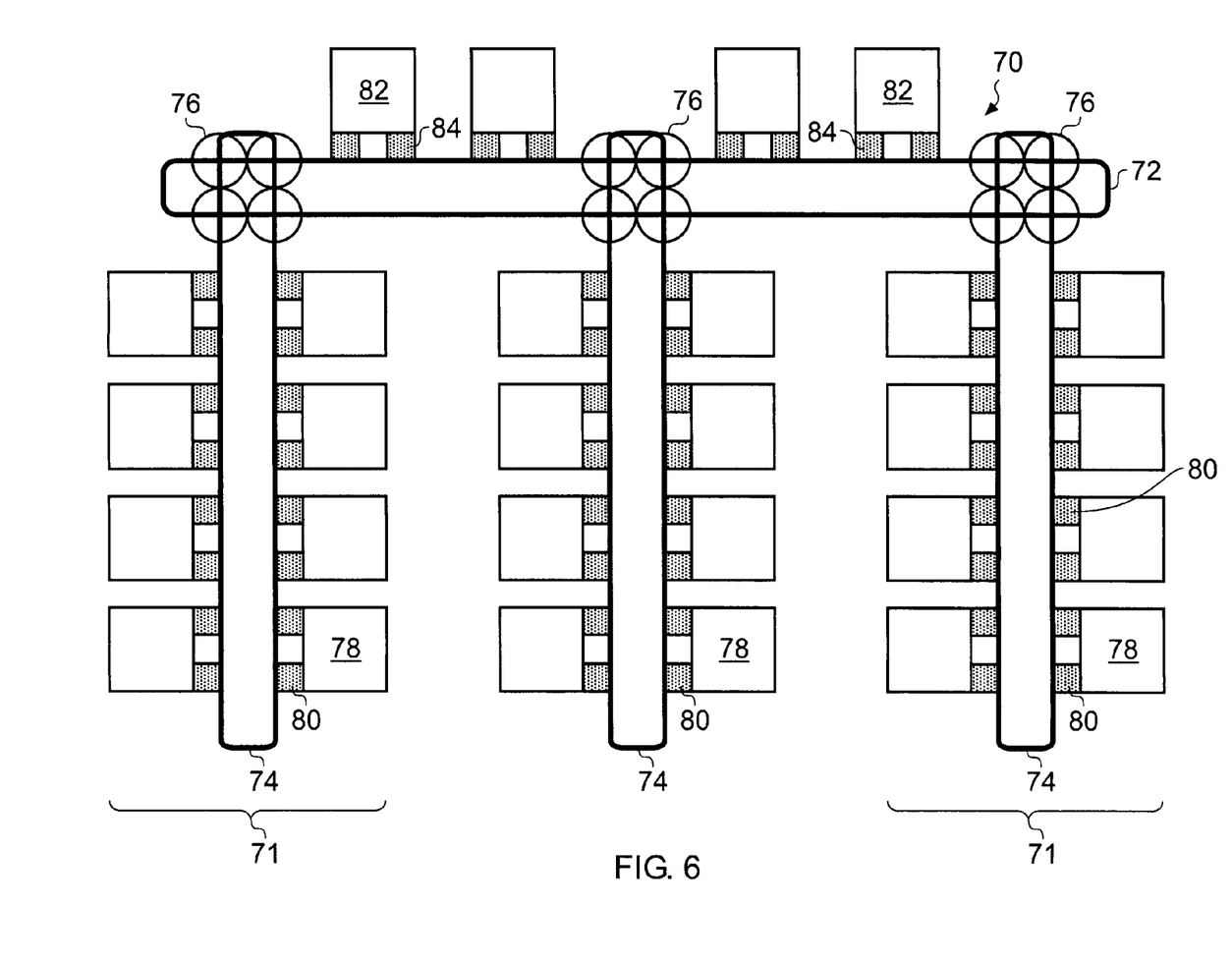
FIG. 6 is a schematic plan view of a wafer transport system in which the present invention may be applied.

FIG. 6 shows a schematic plan view of an automated material handling system (AMHS) 70 in which the invention may be implemented. The AMHS 70 comprises three bays 71, each of which is made up of two opposing rows of tools 78 which face inwards towards. Each tool has one or more load ports 80 where a wafer transporter (not shown) can be deposited whereupon its wafers are unloaded and processed by the tool. Wafer transporters are moved within a bay 71 e.g. between tools 78 in a bay 71, along an intra-bay overhead rail 74. Wafer transporters are moved between bays 71 along an inter-bay rail 72. Rail transfer mechanisms 76 are provided at each junction between an intra-bay rail 74 and the inter-bay rail 72 to permit the wafer transporters to be efficiently transferred between the rail types. The transport and transfer of the wafer transporters may be controlled automatically by a central computer (not shown).

For the system to operate efficiently it may be desirable for wafers awaiting treatment to be parked in a convenient location, e.g. on storage shelves 82 below the inter-bay rail 72.

In an embodiment of the invention, measurement zones 84 containing equipment for performing metrology measurements on wafer transporters may be located on the storage shelves 82, i.e. may be located in an inter-bay region. Measurement zones may also be provided within the bays 71, i.e. one or more of the tools 78 within a bay may be a metrology tool adapted to perform a metrology measurement on a loaded wafer transporter or on the extracted contents of a wafer transporter. Alternatively or additionally, the load port 80 of a tool may have metrology equipment integrated therein.

The invention claimed is:

1. A method of monitoring semiconductor wafer fabrication in a fabrication environment comprising an automated material handling system, the automated material handling system comprising:
   a plurality of bays, each bay of the plurality of bays having:
      (a) a plurality of wafer processing apparatuses for processing semiconductor wafers, each apparatus of the plurality of wafer processing apparatuses having a respective unloading and reloading mechanism for unloading semiconductor wafers from the loaded wafer transporter at the wafer processing apparatus for processing by the wafer processing apparatus and for reloading processed semiconductor wafers into the wafer transporter at the wafer processing apparatus, and
      (b) an intra-bay transport mechanism for moving a wafer transporter loaded with one or more semiconductor wafers between the plurality of wafer processing apparatuses,
   an inter-bay transport mechanism for moving the loaded wafer transporter between the plurality of bays; and
   measurement apparatus for detecting a mass of the loaded wafer transporter, the measurement apparatus being provided on, or accessible from, the inter-bay transport mechanism;

the method comprising:
   moving a wafer transporter loaded with one or more semiconductor wafers to the measurement apparatus using the inter-bay transport mechanism;
   obtaining a first metrology measurement for the loaded wafer transporter by detecting a first mass of the loaded wafer transporter using the measurement apparatus;
   moving the loaded wafer transporter to a first bay of the plurality of bays using the inter-bay transport mechanism;
   moving the loaded wafer transporter to a first wafer processing apparatus of the plurality of wafer processing apparatuses of the first bay using the intra-bay transport mechanism of the first bay;
   unloading the one or more semiconductor wafers from the loaded wafer transporter at the first wafer processing apparatus using the unloading and reloading mechanism of the first wafer processing apparatus;
   processing the unloaded one or more semiconductor wafers using the first wafer processing apparatus;
   reloading the one or more processed semiconductor wafers into the wafer transporter at the first wafer processing apparatus using the unloading and reloading mechanism of the first wafer processing apparatus;

moving the loaded wafer transporter to the measurement apparatus, first using the intra-bay transport mechanism of the first bay and then, second using the inter-bay transport mechanism;

obtaining a second metrology measurement for the loaded wafer transporter by detecting a second mass of the loaded wafer transporter using the measurement apparatus;

detecting a change in mass of the one or more processed semiconductor wafers caused by the processing of the one or more semiconductor wafers at the first wafer processing apparatus based on the first and second metrology measurements; and outputting metrology measurement data that is indicative of the change in mass of the one or more processed semiconductor wafers caused by the processing of the one or more semiconductor wafers at the first wafer processing apparatus.

2. A method according to claim 1, wherein the processing the unloaded one or more semiconductor wafers comprises depositing or removing material from the one or more semiconductor wafers.

3. A method according to claim 1, wherein the wafer transporter is a Front Opening Unified Pod (FOUP) or a Standard Machine Interface (SMIF).

4. A method according to claim 1, wherein detecting the first and second mass of the loaded wafer transporter includes measuring on a weighing instrument a weight force due to gravity of the loaded wafer transporter.

5. A method according to claim 4 including determining the buoyancy exerted on the loaded wafer transporter by the atmosphere at the weighing instrument.

6. A method according to claim 1, wherein detecting the first and second mass of the loaded wafer transporter includes vibrating the loaded wafer transporter and measuring a frequency response of the wafer transporter.

7. A method according to claim 1, wherein the method further comprises:

moving the loaded wafer transporter to a second bay of the plurality of bays using the inter-bay transport mechanism;

moving the loaded wafer transporter to a second wafer processing apparatus of the plurality of wafer processing apparatuses of the second bay using the intra-bay transport mechanism of the second bay;

uploading the one or more semiconductor wafers from the loaded wafer transporter at the second wafer processing apparatus using the unloading and reloading mechanism of the second wafer processing apparatus;

processing the unloaded one or more semiconductor wafers using the second wafer processing apparatus;

reloading the one or more processed semiconductor wafers into the wafer transporter at the second wafer processing apparatus using the unloading and reloading mechanism of the second wafer processing apparatus;

moving the loaded wafer transporter to the measurement apparatus first using the intra-bay transport mechanism of the second bay and then second using the inter-bay transport mechanism;

obtaining a third metrology measurement for the loaded wafer transporter by detecting a third mass of the loaded wafer transporter using the measurement apparatus; and comparing the second and third metrology measurements to monitor the treatment of the wafers.

8. A method according to claim 2, wherein the depositing material comprises depositing material using a deposition technique selected from the group consisting of CVD, PECVD and PVD.

9. A method according to claim 2, wherein the removing material comprises removing material using a technique selected from the group consisting of chemical etching, CMP, cleaning, ion implantation and lithography.

10. A method according to claim 1, wherein the measurement apparatus is provided at an interchange point between the inter-bay transport mechanism and an intra-bay transport mechanism.

11. A method according to claim 1, wherein the measurement apparatus is located on a storage shelf below an inter-bay rail of the inter-bay transport mechanism.

* * * * *